(12) United States Patent
Honma (10) Patent No.: US 11,339,472 B2
(45) Date of Patent: May 24, 2022

(54) SUBSTRATE PROCESSING APPARATUS

(71) Applicant: Tokyo Electron Limited, Tokyo (JP)

(72) Inventor: Manabu Honma, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 16/868,825

(22) Filed: May 7, 2020

(65) Prior Publication Data

US 2020/0354832 A1 Nov. 12, 2020

(30) Foreign Application Priority Data

May 10, 2019 (JP) .............................. JP2019-089597

(51) Int. Cl.
| | |
|---|---|
| H01J 37/32 | (2006.01) |
| C23C 16/44 | (2006.01) |
| C23C 16/455 | (2006.01) |
| H01L 21/687 | (2006.01) |
| C23C 16/458 | (2006.01) |

(52) U.S. Cl.
CPC ...... *C23C 16/4412* (2013.01); *C23C 16/4584* (2013.01); *C23C 16/45502* (2013.01); *C23C 16/45536* (2013.01); *C23C 16/45544* (2013.01); *C23C 16/45551* (2013.01); *H01J 37/3222* (2013.01); *H01J 37/32449* (2013.01); *H01J 37/32715* (2013.01); *H01J 37/32834* (2013.01); *H01L 21/68714* (2013.01); *H01L 21/68764* (2013.01)

(58) Field of Classification Search
CPC .......... C23C 16/4412; C23C 16/45502; C23C 16/45536; C23C 16/45544; C23C 16/45551; C23C 16/4584; C23C 16/45534; C23C 16/45542; C23C 16/511; C23C 16/345; C23C 16/308; H01J 37/3222; H01J 37/32449; H01J 37/32715; H01J 37/32834; H01L 21/68714; H01L 21/68764; H01L 21/0217; H01L 21/02211; H01L 21/02274; H01L 21/0228; H01L 21/68771
USPC ........................ 118/719; 156/345.31, 345.32
See application file for complete search history.

(56) References Cited

U.S. PATENT DOCUMENTS

| | | | |
|---|---|---|---|
| 6,291,800 B1 * | 9/2001 | Shirakawa | G03F 7/40 118/724 |
| 6,380,518 B2 * | 4/2002 | Shirakawa | H01L 21/67109 118/724 |

(Continued)

FOREIGN PATENT DOCUMENTS

JP 2017-017304 1/2017

*Primary Examiner* — Rudy Zervigon
(74) *Attorney, Agent, or Firm* — IPUSA, PLLC (57) ABSTRACT

A film deposition apparatus includes a process chamber, and a turntable in the process chamber to receive a substrate. An exhaust port is provided outside the turntable to evacuate the process chamber. An exhaust box is provided in a space between a ceiling surface of the process chamber and the surface of the turntable so as to surround a certain region along the circumferential direction and a radial direction by side walls so as to include a region upstream of the exhaust port in a rotational direction of the turntable. A gas supply unit to supply a gas into the exhaust box is provided. The exhaust box includes an outflow port in a side wall closest to the exhaust port such that a conductance of a gas flowing from the exhaust box increases with increasing distance from the exhaust port.

14 Claims, 9 Drawing Sheets

(56) References Cited

U.S. PATENT DOCUMENTS

| | | | | |
|---|---|---|---|---|
| 6,972,055 B2* | 12/2005 | Sferlazzo | ............ | C23C 16/45508 156/345.31 |
| 8,043,432 B2* | 10/2011 | Dip | .................. | C23C 16/45551 118/719 |
| 8,187,679 B2* | 5/2012 | Dickey | ................ | C23C 16/545 427/569 |
| 8,372,202 B2* | 2/2013 | Kato | ................ | H01L 21/02104 118/730 |
| 8,470,718 B2* | 6/2013 | Lee | .................. | H01L 21/02521 438/763 |
| 8,691,669 B2* | 4/2014 | Lee | .................. | C23C 16/45551 438/483 |
| 8,746,170 B2* | 6/2014 | Orito | ................ | H01L 21/68764 156/345.31 |
| 8,758,512 B2* | 6/2014 | Lee | ........................ | C23C 16/32 156/345.33 |
| 8,845,857 B2* | 9/2014 | Ohizumi | ............ | H01L 21/67748 156/345.55 |
| 9,093,490 B2* | 7/2015 | Kato | ................ | C23C 16/45589 |
| 9,365,928 B2* | 6/2016 | Saido | ................ | H01L 21/6776 |
| 9,892,909 B2* | 2/2018 | Fukiage | .............. | C23C 16/0209 |
| 10,246,775 B2* | 4/2019 | Kato | ................ | C23C 16/45544 |
| 10,480,073 B2* | 11/2019 | Murakawa | ........ | C23C 16/45561 |
| 10,573,512 B2* | 2/2020 | Oyama | ................ | H01L 21/022 |
| 10,714,332 B2* | 7/2020 | Fukiage | ............ | H01L 21/0228 |
| 11,174,553 B2* | 11/2021 | Doering | ............ | C23C 16/45544 |
| 11,189,502 B2* | 11/2021 | Bera | ................ | H01L 21/67017 |
| 11,201,053 B2* | 12/2021 | Fukiage | ............ | H01L 21/02304 |
| 2004/0052972 A1* | 3/2004 | Schmitt | .................... | C30B 25/02 118/715 |
| 2004/0129212 A1* | 7/2004 | Gadgil | .............. | C23C 16/45578 118/728 |
| 2004/0187784 A1* | 9/2004 | Sferlazzo | ............ | C23C 16/4584 118/719 |
| 2006/0177579 A1* | 8/2006 | Shin | .................... | C23C 16/4584 118/723 R |
| 2008/0026162 A1* | 1/2008 | Dickey | ............. | C23C 16/45551 427/595 |
| 2009/0017190 A1* | 1/2009 | Sferlazzo | .......... | C23C 16/45589 118/712 |
| 2010/0037820 A1* | 2/2010 | Lee | .................. | C23C 16/45551 118/719 |
| 2010/0041213 A1* | 2/2010 | Lee | .................. | C23C 16/45551 118/729 |
| 2010/0229797 A1* | 9/2010 | Kato | ...................... | C23C 16/402 118/730 |
| 2010/0310771 A1* | 12/2010 | Lee | ...................... | C01B 21/076 427/255.28 |
| 2011/0100489 A1* | 5/2011 | Orito | ................ | H01L 21/68771 137/560 |
| 2011/0212625 A1* | 9/2011 | Toyoda | ............. | C23C 16/45565 438/758 |
| 2012/0094011 A1* | 4/2012 | Hishiya | ................... | C23C 16/40 427/8 |
| 2012/0094149 A1* | 4/2012 | Lee | ........................ | C23C 16/403 427/255.28 |
| 2012/0114877 A1* | 5/2012 | Lee | .................. | C23C 16/45551 118/723 MP |
| 2012/0125258 A1* | 5/2012 | Lee | .................. | H01J 37/32752 118/719 |
| 2012/0199067 A1* | 8/2012 | Morozumi | ........ | H01L 21/67109 118/719 |
| 2012/0213945 A1* | 8/2012 | Lee | ........................ | C23C 16/345 427/255.393 |
| 2012/0225193 A1* | 9/2012 | Yudovsky | ......... | C23C 16/45551 427/58 |
| 2012/0225194 A1* | 9/2012 | Yudovsky | ............... | C23C 16/54 901/30 |
| 2012/0225204 A1* | 9/2012 | Yudovsky | ......... | C23C 16/45551 427/248.1 |
| 2012/0225206 A1* | 9/2012 | Yudovsky | ......... | H01L 21/67715 118/728 |
| 2012/0225207 A1* | 9/2012 | Yudovsky | ......... | C23C 16/45551 118/724 |
| 2012/0301632 A1* | 11/2012 | Lee | ........................ | C23C 16/50 427/569 |
| 2013/0260539 A1* | 10/2013 | Lee | .................. | C23C 16/45551 438/597 |
| 2014/0027777 A1* | 1/2014 | Lee | ........................ | C30B 25/183 117/89 |
| 2015/0104574 A1* | 4/2015 | Lee | .................. | C23C 16/45551 427/255.28 |
| 2015/0148557 A1* | 5/2015 | Lee | ........................ | C23C 16/452 427/255.394 |
| 2015/0194298 A1* | 7/2015 | Lei | ...................... | H01L 21/02194 438/782 |
| 2015/0275365 A1* | 10/2015 | Pak | ...................... | C23C 16/4584 427/255.28 |
| 2015/0307988 A1* | 10/2015 | Saido | .................. | C23C 16/4412 438/758 |
| 2015/0361550 A1* | 12/2015 | Yabe | ................ | H01L 21/02164 438/782 |
| 2016/0020116 A1* | 1/2016 | Lee | ........................ | C23C 16/50 438/798 |
| 2016/0189950 A1* | 6/2016 | Oyama | ................ | H01L 21/0228 438/763 |
| 2016/0340779 A1* | 11/2016 | Lee | ...................... | H01J 37/3244 |
| 2017/0107614 A1* | 4/2017 | Lee | ...................... | C23C 16/0272 |
| 2017/0186606 A1* | 6/2017 | Fukiage | .............. | C23C 16/0209 |
| 2017/0271143 A1* | 9/2017 | Fukiage | .............. | C23C 16/0272 |
| 2020/0040456 A1* | 2/2020 | Kato | ................ | H01L 21/68764 |
| 2020/0294787 A1* | 9/2020 | Fukiage | ................ | C23C 16/045 |
| 2020/0354832 A1* | 11/2020 | Honma | ............. | C23C 16/45551 |
| 2021/0087684 A1* | 3/2021 | Sasaki | ............. | C23C 16/45551 |
| 2021/0130950 A1* | 5/2021 | Hane | ................ | C23C 16/45544 |
| 2021/0249264 A1* | 8/2021 | Kato | ................ | H01L 21/02529 |
| 2021/0249265 A1* | 8/2021 | Kato | ................ | H01L 21/02488 |

* cited by examiner

SUBSTRATE PROCESSING APPARATUS

CROSS-REFERENCE TO RELATED APPLICATION

The present application is based on and claims priority to Japanese Patent Application No. 2019-089597 filed on May 10, 2019, the entire contents of which are hereby incorporated herein by reference.

BACKGROUND OF THE INVENTION

1. Field of the Invention

The present disclosure relates to a substrate processing apparatus.

2. Description of the Related Art

Conventionally, as disclosed in Japanese Laid-Open Patent Application Publication No. 2017-17304, a substrate processing method is known using a processing chamber that includes a first process gas supply region, a first exhaust port provided for evacuating a first process gas supplied to the first process gas supply region, a second exhaust port provided for evacuating a second process gas supplied to a second process gas supply region, and a communication space communicating the first exhaust port to the second exhaust port, wherein an exhaust pressure of the first exhaust port is increased to a predetermined pressure higher than an exhaust pressure of the second exhaust port, thereby preventing the second process gas from flowing to the first exhaust port, while performing substrate processing.

SUMMARY OF THE INVENTION

Some embodiment of the present disclosure provides a substrate processing apparatus that uniformizes the distribution of gas by gas supply and exhaustion.

In order to achieve the above-described object, according to some embodiment of the present disclosure, there is provided a substrate processing apparatus that includes a process chamber, and a turntable provided in the process chamber and configured to receive a substrate on a surface along a circumferential direction. At least one exhaust port is provided on an outer side of the turntable and configured to evacuate the process chamber. At least one exhaust box is provided in a space between a ceiling surface of the process chamber and the surface of the turntable so as to surround a certain region along the circumferential direction and a radial direction of the turntable by side walls so as to include a region upstream of the at least one exhaust port in a rotational direction of the turntable. A gas supply unit configured to supply a gas into the at least one exhaust box is further provided. The at least one exhaust box includes at least one outflow port in a side wall extending along a radial direction of the turntable, the side wall being provided closest to the at least one exhaust port of the side walls of the at least one exhaust box, such that a conductance of a first gas flowing out of the at least one exhaust box increases with increasing distance from the at least one exhaust port and that the conductance of the first gas flowing out of the at least one exhaust box becomes greater than a conductance of a second gas flowing toward the at least one exhaust port from any other region in the process chamber.

Additional objects and advantages of the embodiments are set forth in part in the description which follows, and in part will become obvious from the description, or may be learned by practice of the disclosure. The objects and advantages of the disclosure will be realized and attained by means of the elements and combinations particularly pointed out in the appended claims. It is to be understood that both the foregoing general description and the following detailed description are exemplary and explanatory and are not restrictive of the disclosure as claimed.

DETAILED DESCRIPTION OF THE PREFERRED EMBODIMENTS

Hereinafter, embodiments for carrying out the present disclosure will be described in detail with reference to the drawings.

Substrate Processing Apparatus

Hereinafter, a configuration of a substrate processing apparatus according to an embodiment of the present disclosure will be described with reference to FIGS. 1 to 5. In the present examples, a thin film of a silicon nitride film (SiN film) is deposited on a semiconductor wafer (hereinafter referred to as a "wafer") W, which forms a substrate, by reacting a source gas containing silicon (Si), such as dichlorosilane ($SiH_2Cl_2$: DCS) gas with ammonia ($NH_3$) gas. In the present specification, a silicon nitride film is expressed as SiN regardless of the stoichiometric ratio of Si and N. Accordingly, the description SiN includes, for example, $Si_3N_4$.

Figure 1:
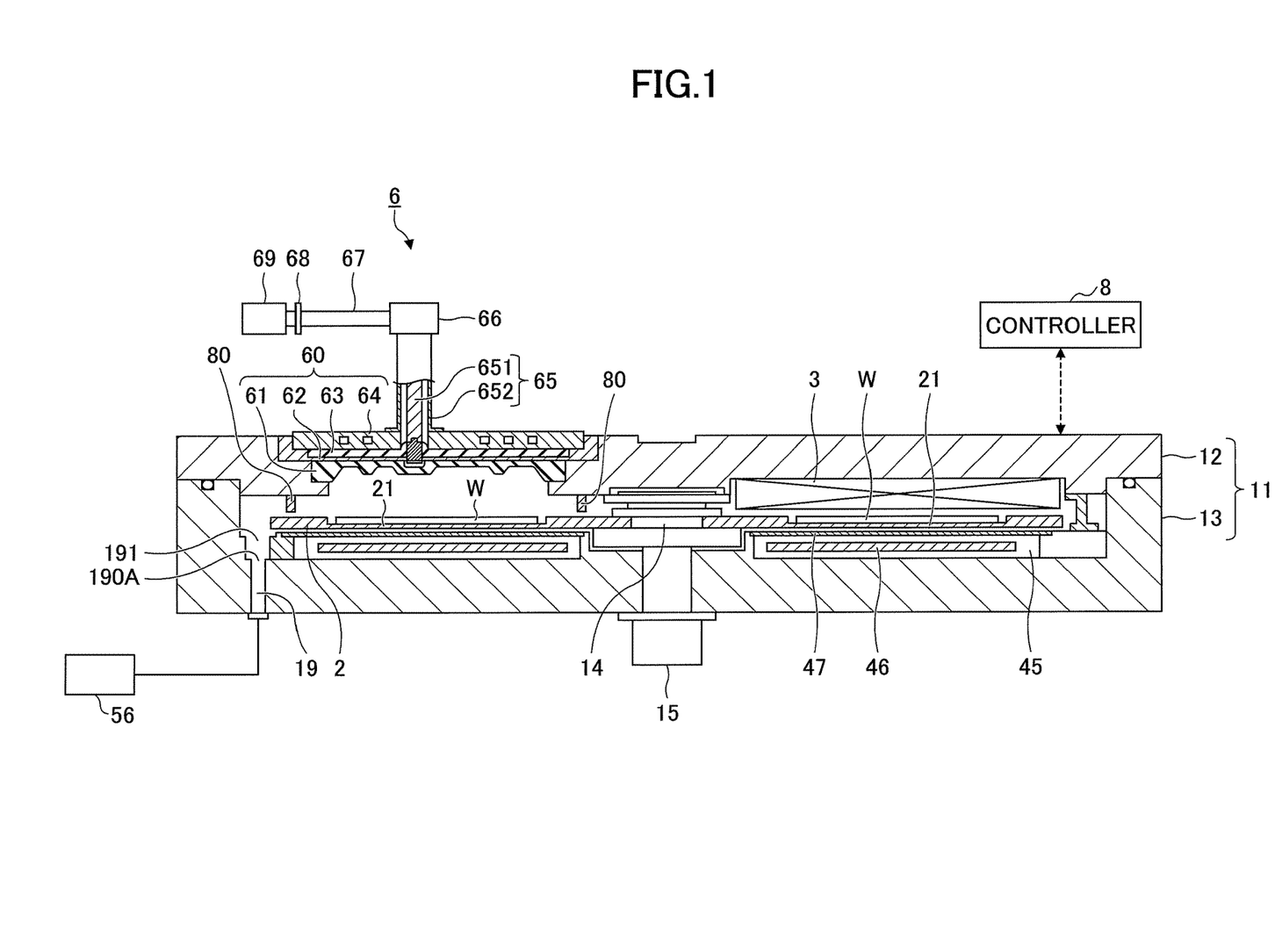
FIG. 1 is a vertical side view of a film deposition processing apparatus according to an embodiment of the present disclosure.
Figure 2:
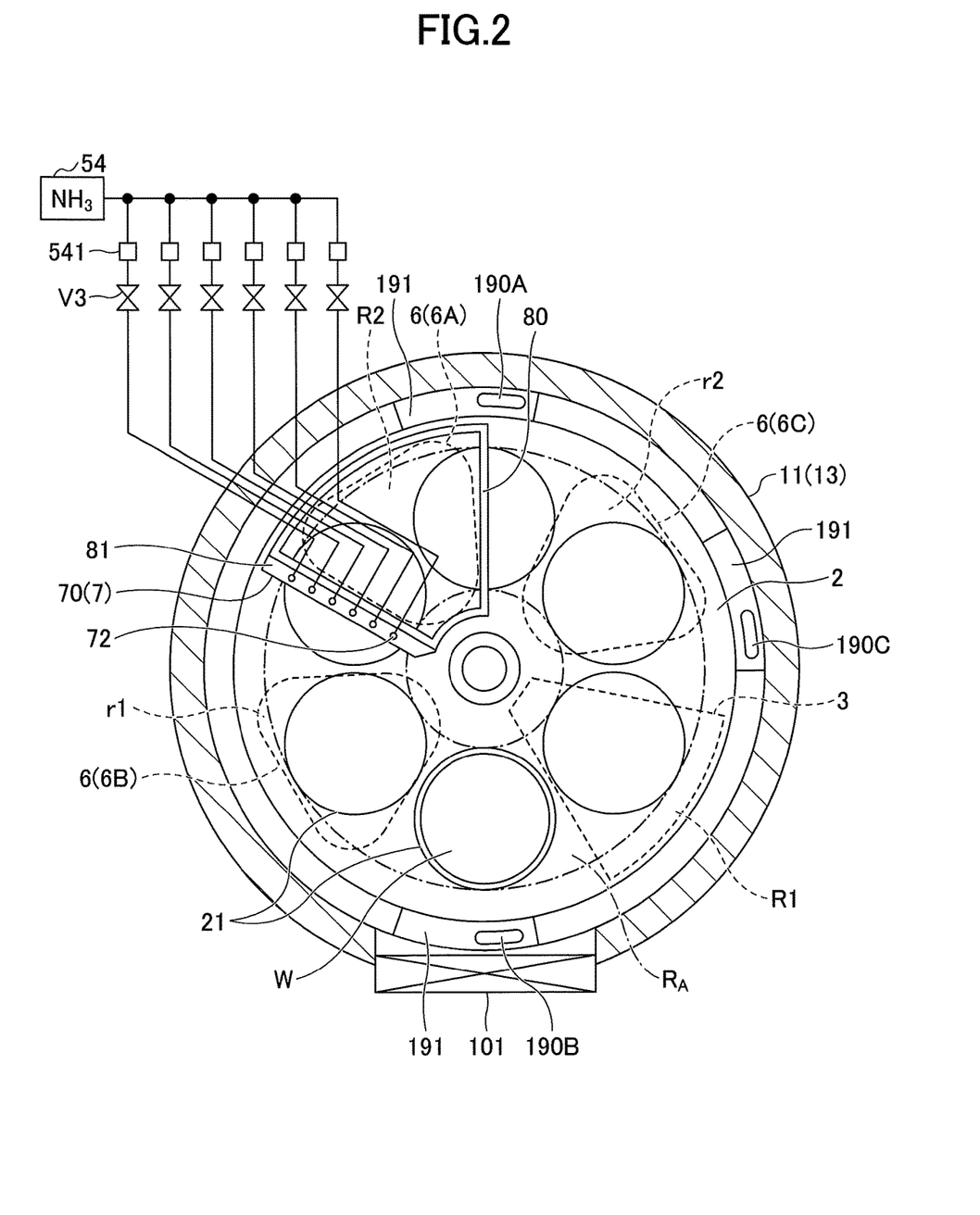
FIG. 2 is a horizontal cross-sectional view of a film deposition processing apparatus.

As illustrated in FIGS. 1 and 2, the substrate processing apparatus of the present disclosure includes a vacuum chamber 11 that provides a processing space in which a film deposition process is performed. The vacuum chamber 11 comprises a chamber body 13 forming a side wall and a bottom of the vacuum chamber 11, and a top plate 12 for airtightly sealing an opening on the upper side of the chamber body 13. Inside the vacuum chamber 11, a turntable 2 made of a circular plate is provided and is configured to rotate freely about the vertical axis by a rotation drive mechanism 15 such as a motor through a rotary shaft 14 extending vertically downward.

Figure 3:
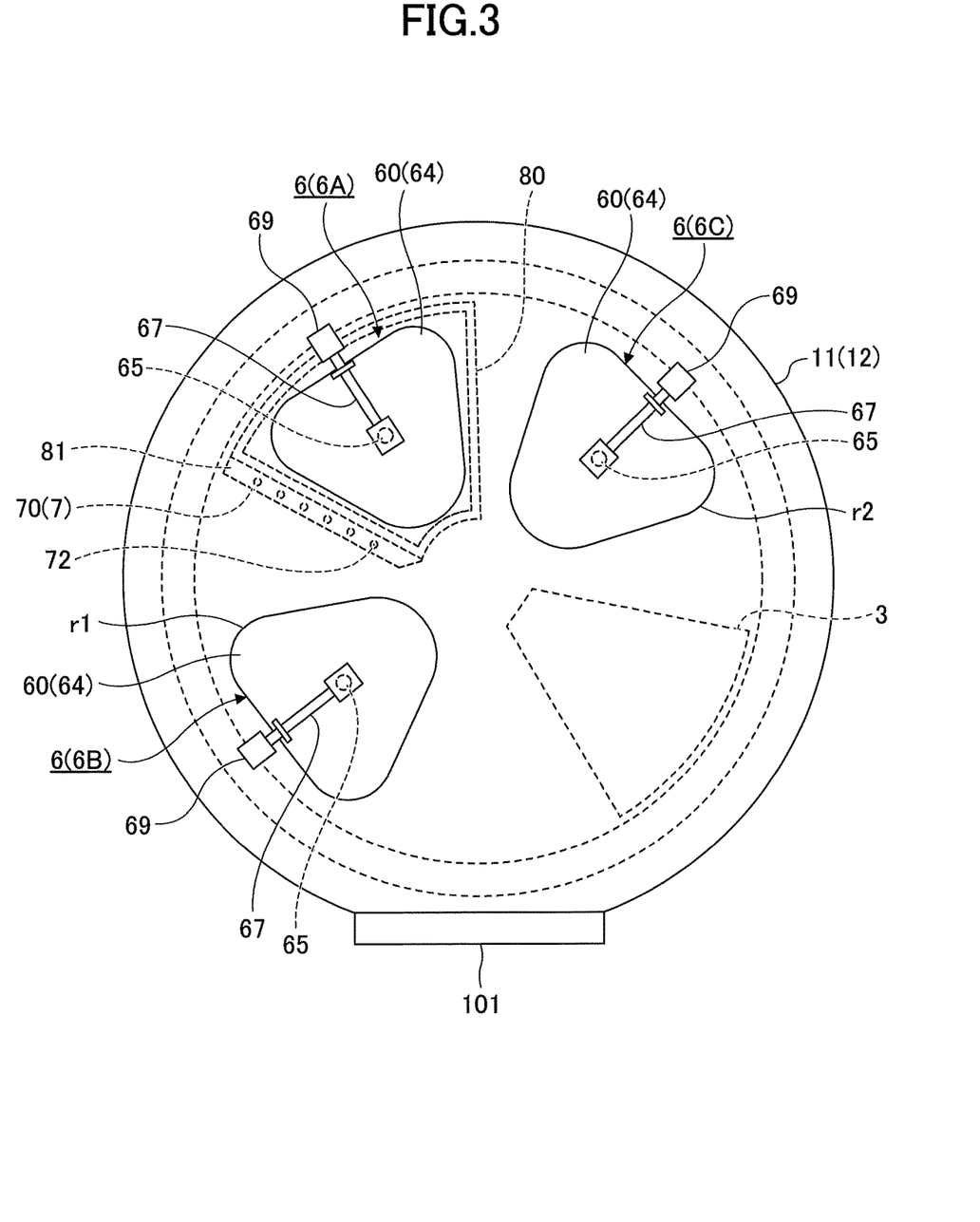
FIG. 3 is a plan view illustrating a film deposition processing apparatus from the top surface side.

On the upper surface of the turntable 2, for example, six receiving areas 21 are arranged in a circumferential direction around the rotation center thereof, as illustrated in FIG. 2, and each receiving area 21 is formed as a circular recess having a diameter slightly larger than the wafer W. The receiving area 21 comprises a receiving section to receive a substrate thereon. As illustrated in FIG. 1, a flat annular groove 45 is formed in the bottom surface of the chamber body 13 along the circumferential direction of the turntable 2, and a heater 46 is disposed within the annular groove 45. As illustrated in FIGS. 2 and 3, the side wall of the vacuum chamber 11 (the chamber body 13) includes an entry/exit section 101 that is configured to be open/close by a gate valve (not illustrated). The wafer W held in an external transfer mechanism (not illustrated) is carried into the vacuum chamber 11 through the entry/exit section 101 and is transferred to each receiving area 21 of the turntable 2 using lift pins (not illustrated).

The substrate processing apparatus includes a source gas unit 3 forming a source gas supply section, and the source gas unit 3 is provided on the underside of the top plate 12 facing the upper surface of the turntable 2, as illustrated in FIG. 1. As illustrated in FIGS. 2 and 3, the shape in a plan view of the source gas unit 3 is a fan-like shape formed by partitioning a revolution surface RA of the receiving area 21 in a direction intersecting the direction of the rotation of the receiving area 21. The aforementioned revolution surface RA is an annular-shaped area surrounded by a dotted line in FIG. 2, that is, an area through which the receiving area 21 passes when the turntable 2 is rotated.

Figure 4:
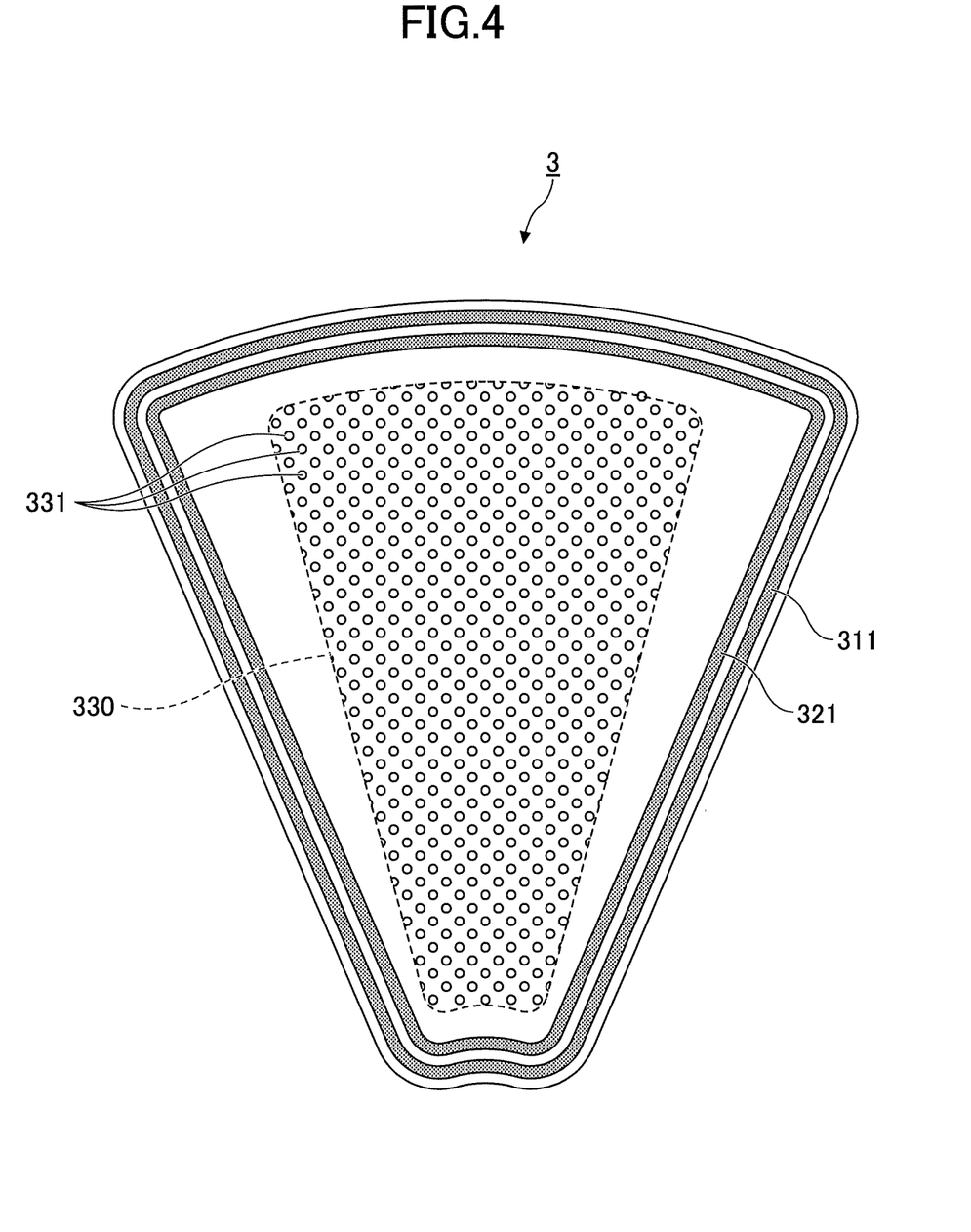
FIG. 4 is a plan view illustrating a source gas unit provided in a first region as seen from the bottom side.

As illustrated in FIG. 4, a gas discharge hole 331, an exhaust port 321, and a purge gas discharge hole 311 forming a discharge unit open in the lower surface of the source gas unit 3. To facilitate identification in the drawing, the exhaust port 321 and the purge gas discharge hole 311 are shown with multiple dots. The plurality of gas discharge holes 331 is arranged in a fan-shaped region 330 inside the circumference of the lower surface of the source gas unit 3, and discharges DCS gas as the source gas in a shower-like manner downward. The source gas containing silicon is not limited to DCS gas. For example, hexachlorodisilane (HCD), tetrachlorosilane (TCS), or the like may be used. A gas flow passage (not illustrated) is provided in the source gas unit 3 so as to independently supply the source gas to each of the gas discharge holes 331. The upstream side of the gas flow passage is connected to a supply source of DCS gas via a pipe with a gas supply device including a valve and a mass flow controller. Here, the gas supply device, the pipe, and the supply source of DCS gas is not illustrated in the drawing.

The exhaust port 321 and the purge gas discharge hole 311 are annularly opened at the periphery of the lower surface of the source gas unit 3 so as to surround the fan-shaped region 330 and to face the upper surface of the turntable 2, and the purge gas discharge hole 311 is located on the outer side of the exhaust port 321. The area inside the exhaust port 321 on the turntable 2 constitutes an adsorption region R1 in which the source gas is adsorbed on the surface of the wafer W. An exhaust mechanism (not illustrated) is connected to the exhaust port 321, and a supply source of the purge gas (not illustrated) such as argon (Ar) gas is connected to the purge gas discharge hole 311.

During the film deposition process, the discharge of the source gas from the gas discharge holes 331, the exhaustion from the exhaust port 321, and the discharge of the purge gas from the purge gas discharge hole 311 are performed together. As a result, the source gas and the purge gas discharged toward the turntable 2 flow back from the upper surface of the turntable 2 toward the exhaust port 321 and evacuated from the exhaust port 321. In this manner, by performing the discharge and exhaustion of the purge gas, the atmosphere of the adsorption region R1 is separated from the external atmosphere, and the source gas can be supplied only to the adsorption region R1. In addition to the role of separating the atmosphere, the purge gas also has a role of removing from the wafer W the source gas that is excessively adsorbed on the wafer W.

Next, a reaction region R2 for supplying $NH_3$ gas converted to plasma will be described. As illustrated in FIG. 2, the reaction region R2 is arranged in a rotational direction of the turntable 2 (clockwise when viewed from the top side in the present example) with respect to the source gas unit 3. The reaction region R2 includes an exhaust box 80 surrounding the reaction region R2. The exhaust box 80 is a member for uniformizing the flow rate and the concentration of $NH_3$ gas converted to the plasma in the radial direction.

The exhaust box 80 has sidewalls and is provided to enclose the reactive region R2 and to encompass the reactive region R2 in a plan view. The exhaust box 80 has sidewalls and may have various configurations as long as the exhaust box 80 surrounds the perimeter of the reaction region R2, and for example, may be provided on the underside of the top plate 12 and may be continuously coupled to the top plate 12. The exhaust box 80 is naturally provided above the turntable 2 because the exhaust box 80 must not interfere with the rotation of the turntable 2. The exhaust box 80 is preferably provided so as to extend downward from the lower surface of the top plate 12, because the flow of gas within the exhaust box 80 is difficult to control if there is a gap between the top plate 12 and the upper end of the exhaust box 80.

The exhaust box 80 may be formed into a fan-like shape along the shape of the reaction region R2. In order to uniformize the flow of gas within the reaction region R2, the flow of gas is more easily controlled if the exhaust box 80 is formed along the shape of the reaction region R2.

The exhaust box 80 may be formed of a metallic material such as aluminum. The exhaust box 80 may be configured such that the inner wall is sprayed and coated with ceramics or the like to enhance the plasma resistance.

On the upstream side of the exhaust box 80 in the rotational direction of the turntable 2, a gas injector 70 is provided for supplying $NH_3$ gas to the wafer W within the exhaust box 80. The gas injector 70 forms a reaction gas supply unit, and supplies $NH_3$ gas into the exhaust box 80. The gas injector 70 is formed as a local showerhead disposed along the radial direction of the turntable 2 (in the direction intersecting the revolving direction of the receiving area 21), and multiple, for example, six gas injectors 70 are spaced apart from each other along the radial direction of the turntable 2. For example, the gas injectors 70 are each provided in a side wall 81 upstream of the exhaust box 80.

The gas supply to the gas injector 70 is performed from the ceiling side, as is the case with the showerhead, but the gas discharge holes 73 may be provided in the side wall 81 upstream of the exhaust box 80 and the gas supply into the reaction region R2 may be made laterally from the side wall 81 upstream of the exhaust box 80. Accordingly, control of the flow of $NH_3$ gas parallel to the surface of the turntable 2 in the exhaust box 80 can be facilitated.

Figure 5:
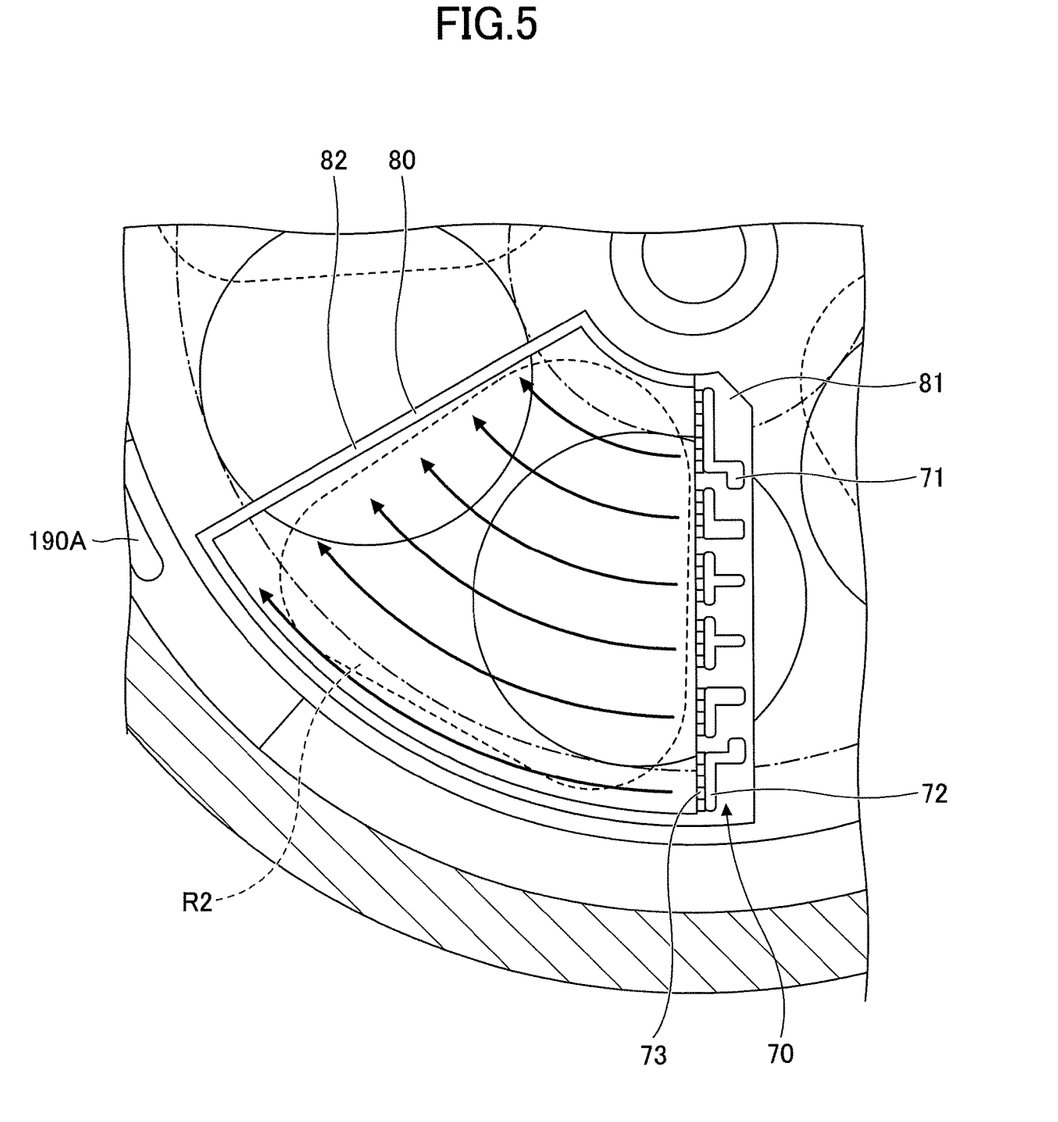
FIG. 5 is an enlarged view of a reaction region R2.

FIG. 5 is an enlarged view of the reaction region R2. The reaction region R2 is surrounded by the exhaust box 80, and six systems of gas injectors 70 are provided in the side wall 81 upstream of the exhaust box 80. Each of the gas injectors 70 has a gas inlet 71, a gas buffer 72, and gas discharge holes 73 in communication with the gas buffer 72 in the upstream side wall 81 of the exhaust box 80.

Accordingly, NH$_3$ gas can be supplied to the reaction region R2 from six locations in the radial direction, and NH$_3$ gas can be supplied to the exhaust box 80 in a flow direction along the rotational direction of the turntable 2. In the present embodiment, an example of supplying NH$_3$ gas from six locations has been described. However, the number of supply locations may be increased or decreased, or the arrangement thereof may be appropriately changed depending on the intended purpose.

Next, the difference between the conventional ALD substrate processing apparatus and the substrate processing apparatus according to the present embodiment will be described.

Figure 6:
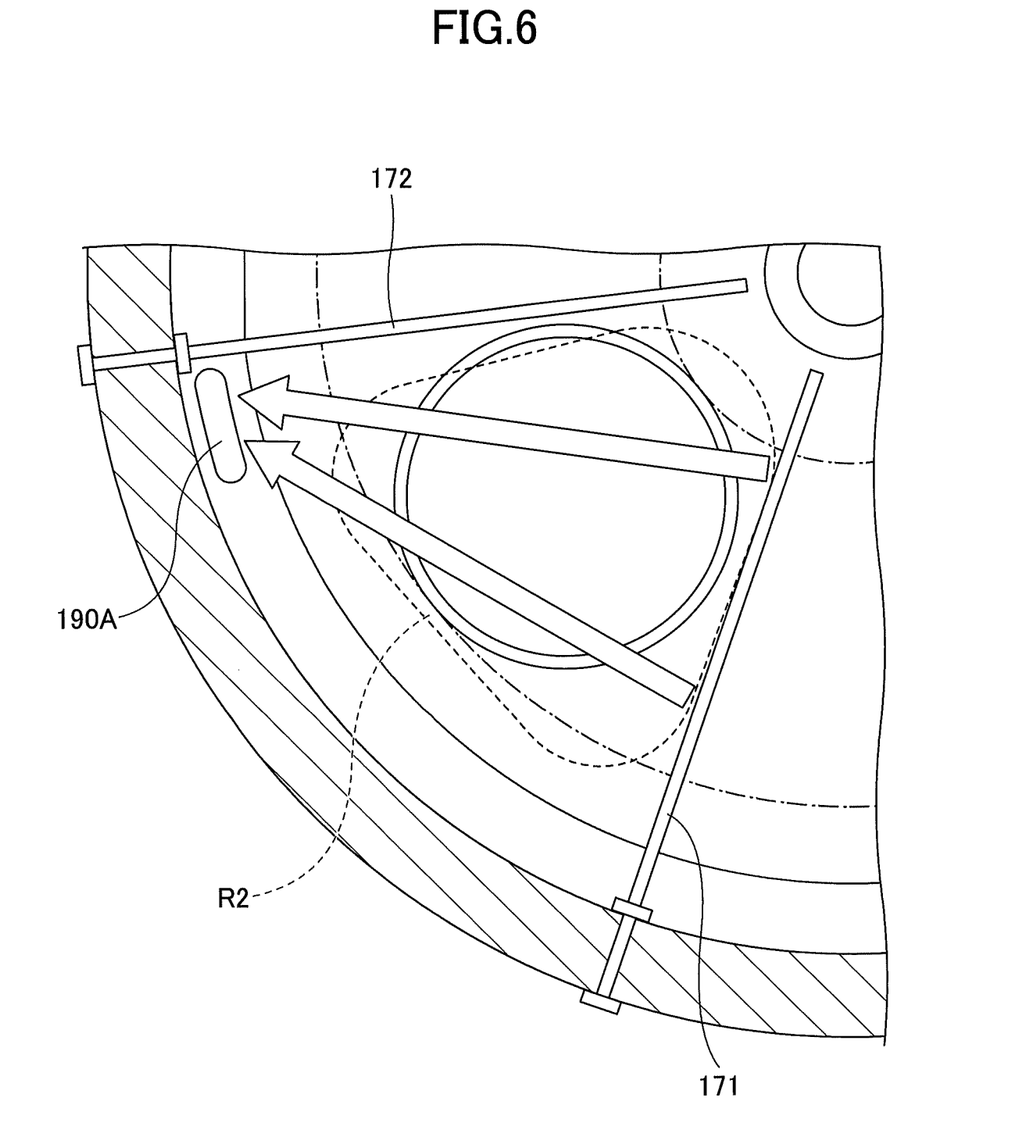
FIG. 6 is a diagram illustrating an example of a conventional ALD substrate processing apparatus.

FIG. 6 is a diagram illustrating an example of a conventional ALD substrate processing apparatus. As illustrated in FIG. 6, a conventional ALD substrate processing apparatus included gas nozzles 171, 172 on both sides of the reaction region R2. Because an exhaust port 191 was provided on the inner side (upstream side) of the gas nozzle 172 provided on the downstream side, NH$_3$ gas supplied from the upstream gas nozzle 171 goes directly toward the exhaust port 191, and thus may be difficult to form a uniform gas flow in the radial direction of the wafer W.

In contrast, in the substrate processing apparatus according to the present embodiment, a substrate processing apparatus is provided in which the flow of NH$_3$ gas is uniformized in the radial direction and plasma processing is uniform in the radial direction.

Figure 7:
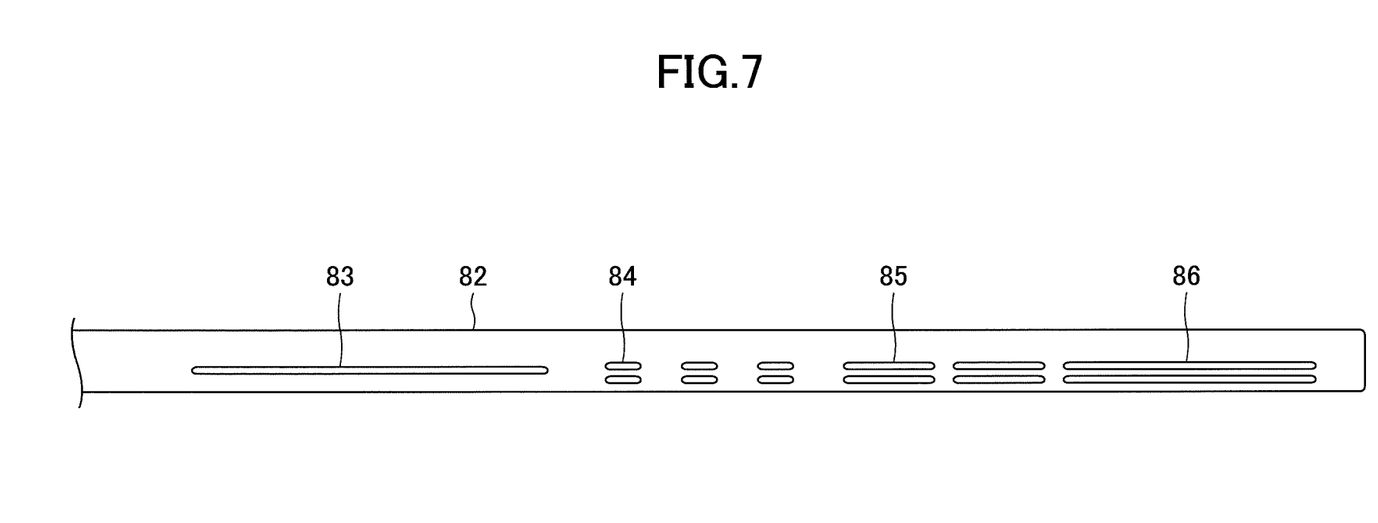
FIG. 7 is an example of a side wall downstream of an exhaust box.

FIG. 7 illustrates an example of a side wall 82 downstream of the exhaust box 80. In FIG. 7, the left side shows the outer peripheral side and the right side shows the axial side. The downstream side wall 82 has outflow ports 83 to 86. The outflow ports 83 to 86 are each shaped differently. The outflow ports 83 to 86 are provided to cooperate with the exhaust port 190A to uniformly circulate NH$_3$ gas within the exhaust box 80.

As illustrated in FIG. 5, the substrate processing apparatus in accordance with the present embodiment is configured to have an exhaust port 190A further downstream of the side wall 82 provided downstream of the exhaust box 80. Therefore, if NH$_3$ gas supplied from each of the six gas injectors 70 into the exhaust box 80 flows along the circumferential direction, a uniform gas flow in the radial direction of the turntable 2 can be formed.

As illustrated in FIG. 7, the outflow ports 83 to 86 provided in the downstream side wall 82 of the exhaust box 80 are adjusted in number and shape to increase the conductance of NH$_3$ gas as the outflow ports 83 to 86 get away from the exhaust port 191A.

That is, because the outflow port 83 on the outermost side is closest to the exhaust port 191A, the amount of gas flowing out is likely to be naturally greater than that on the axial side. Accordingly, on the outer circumferential side, the conductance of NH$_3$ gas can be reduced compared to that of the axial side by providing only a single outflow port 83.

On the other hand, because the outflow port 86 on the axial side of the turntable 2 that is the farthest from the exhaust port 191A has the longest distance from the outlet port 191A, the suction force from the exhaust port 191A is the lowest. Therefore, on the axial side, two outflow ports 86 are provided in a height direction and extending parallel to each other in a lateral direction to increase the conductance and to increase the amount of NH$_3$ gas flowing out.

Similarly, at the outflow port 85 on the slightly outer circumferential side of the outflow port 86, four outflow ports 85 are provided that are shorter than the outlet ports 86 and have a shape wherein the conductance is slightly smaller than that of the outflow port 85.

Here, the conductance is an indicator of gas flow ease. If the entire length is the same, the conductance will naturally decrease if there is a wall in the middle. That is, the conductance increases with successive openings. Further, because the increase in the opening amount in the height direction is more effective than the length in the lengthwise direction (radial direction), the outflow port 83 on the outer peripheral side is made only a single outflow port 83 in the height direction, but the adjacent outflow port 84 on the slightly inner side is shorter than the outflow port 83 in the lengthwise direction and is divided into three pieces. However, because the outflow port 84 extending in the lengthwise direction is divided into two pieces in the height direction, the overall conductance is greater than that of the outflow port 83.

Also, when comparing the outflow port 84 with the outflow port 85 on the inner side, the conductance of the outflow port 85 is greater than that of the outflow port 84 because an area including the six outflow ports 84 have a larger wall area and an area including the four outflow ports 85 have a smaller wall area.

Thus, by adjusting the shape and number of openings in the outflow ports 83 to 86, the conductance of NH$_3$ gas flowing out of the outflow ports 83 to 86 can be adjusted to increase with increasing distance from the exhaust port 191A. By such conductance adjustment, the suction force from the exhaust port 191A can be adjusted to become substantially uniform in the radial direction, and NH$_3$ gas supplied from the gas injector 70 can be suctioned with a uniform suction force in the radial direction. This allows NH$_3$ gas supplied from the six gas discharge holes 72 to be drawn directly along the circumferential direction from the outflow ports 83 to 86 to form parallel side flows. As a result, a plasma process is performed uniformly in the radial direction, and a plasma process with excellent uniformity across the surface of the substrate can be performed.

Also, the conductance of these outflow ports 83 to 86 is set to be higher than that of the other areas capable of being evacuated by the exhaust port 191A. That is, the outflow ports 83 to 86 are configured such that NH$_3$ gas flowing out of the exhaust box 80 is evacuated from the exhaust port 191A first prior to the gas flowing through the other regions. Here, because the space above the turntable 2 and the space outside the turntable 2 are all communicated with each other inside the vacuum chamber 11, and because the suction force from the exhaust port 191A reaches the entire regions in the vacuum chamber 11 although the force magnitude varies from region to region, the conductance of the outflow ports 83 to 86 may be set greater than the conductance at the other regions. Because the region including the outflow ports 83 to 86 is the closest to the exhaust port 191A, this condition may be considered to be naturally satisfied unless the conductance of the gas flowing out of the outflow ports 83 to 86 is made significantly low.

As illustrated in FIG. 2, each gas injector 70 is connected to an NH$_3$ gas supply source 54 via switching valves V3 and V4 and flow control parts 541 and 542. Each gas injector 70 is connected to an inert gas source (not illustrated), for example, Ar gas, and is configured to supply Ar gas at a controlled flow rate at a predetermined timing.

Next, the configuration of a plasma forming unit 6 (6A) that constitutes a plasma forming mechanism for plasma formation of NH$_3$ gas will be described. Because the plasma forming unit 6A is configured in the same manner as the plasma forming unit 6 (6B, 6C) disposed in the first and second modification regions r1, r2 to be described later, the plasma forming unit 6A will be described with reference to FIGS. 1 to 3 and 5. The plasma forming unit 6 includes an antenna unit 60 for emitting microwaves into the vacuum chamber 11, a coaxial waveguide 65 for supplying microwaves toward the antenna unit 60, and a microwave generator 69. The antenna unit 60 is provided on the top plate 12 located above the reaction region R2 to close the opening having an approximately triangular shape corresponding to the reaction region R2.

The antenna unit 60 is formed as a radial line slot antenna (RLSA (registered trademark of Tokyo Electron Co., Ltd.)) including a dielectric window 61, a slot plate 62, a dielectric plate 63 and a cooling jacket 64. The dielectric windows 61 shorten the wavelength of the microwaves, and the periphery thereof is supported by members surrounding the openings formed in the top plate 12. A number of slot holes 621 are formed in the slot plate 62, and the dielectric plate 63 is provided on the slot plate 62.

Figure 8:
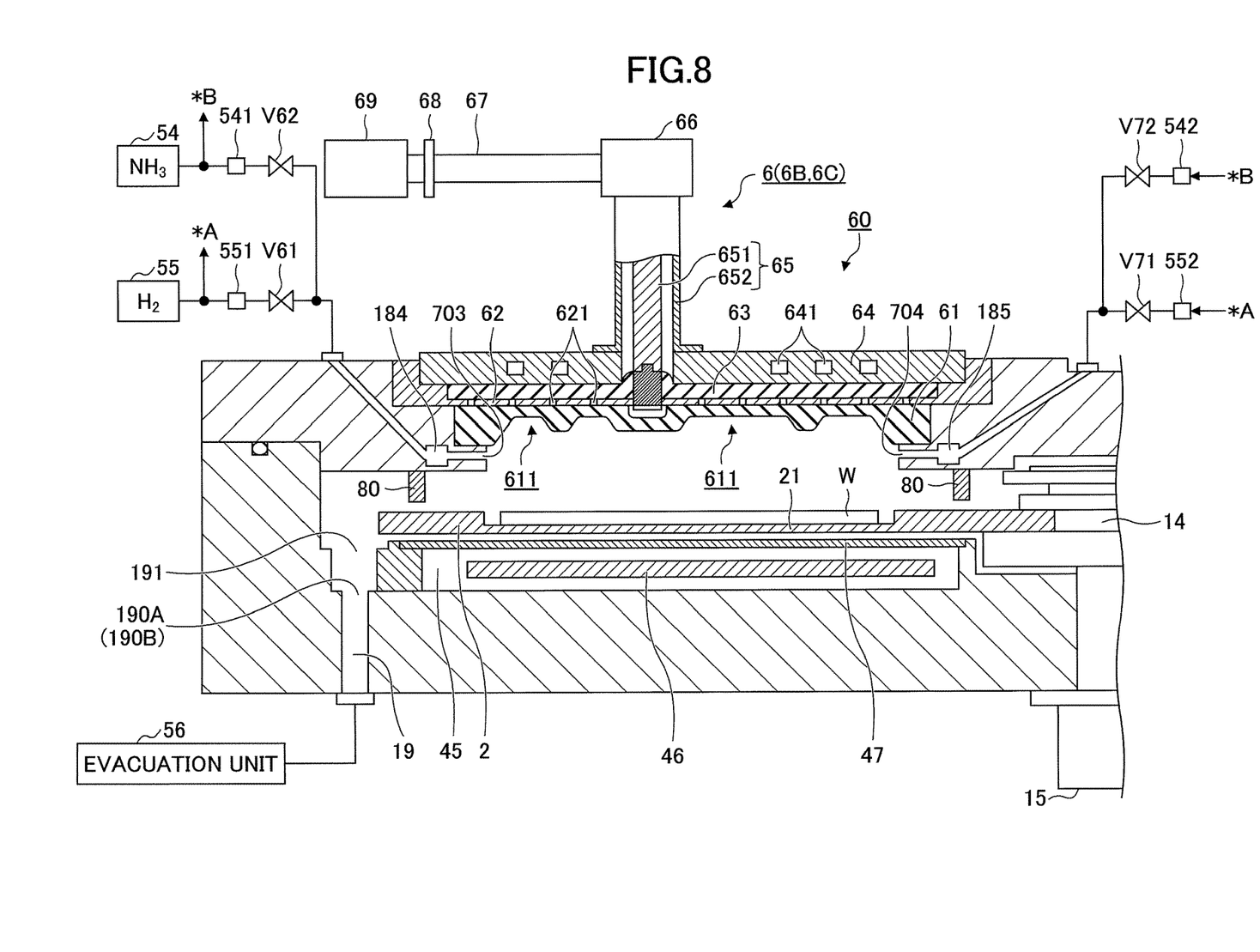
FIG. 8 is an enlarged vertical side view of a first modification region or a second modification region disposed in a film deposition processing apparatus.

In FIGS. 1 and 8, an inner conductor 651 of the coaxial waveguide 65, and an outer conductor of the coaxial waveguide 65 are provided, and the coaxial waveguide 65 is connected to the microwave generator 69 via a mode converter 66, a waveguide 67, and a tuner 68 that is a matching box. The microwave generator 69 generates microwaves at a frequency of, for example, 2.45 GHz. In the plasma forming unit 6, microwaves generated by the microwave generator 69 are supplied through the coaxial waveguide 65 to the dielectric plate 63 and through the slot holes 621 in the slot plate 62 to the space below the dielectric window 61. In this manner, when the turntable 2 is rotated, the wafer W placed on each receiving area 21 passes through the reaction region R2, and $NH_3$ gas converted to plasma is supplied to the entire surface of the wafer W.

Further, as illustrated in FIG. 2, an exhaust channel 191 for evacuating $NH_3$ gas is provided at a location on the bottom side of the chamber body 13 between the turntable 2 and the inner wall surface of the vacuum chamber 11 and along the circumferential direction of the turntable 2 outside the region in which the reaction region R2 is provided. At the bottom of the exhaust groove 191, the exhaust port 190A opens, and an evacuation mechanism 56 is connected to perform a vacuum evacuation within the vacuum chamber 11 through the exhaust passage 19. As described above, the exhaust port 190A is provided at least partially downstream of the side wall 82 provided downstream of the exhaust box 80. That is, the entire exhaust port 190A need not be provided downstream of the downstream sidewall 82 of the exhaust box 80, but is at least partially disposed downstream of the sidewall 82 to suction $NH_3$ gas from the outflow ports 83 to 86 within the exhaust box 80.

The substrate processing apparatus includes a first modification region r1 and a second modified region r2 for performing a modification process on the SiN film. As illustrated in FIG. 2, the first modification region r1 is disposed downstream of the adsorption region R1 and upstream of the reaction region R2 as viewed along the rotational direction of the turntable 2. Meanwhile, the second modification region r2 is disposed at a position downstream of the reaction region R2 and upstream of the adsorption region R1 as viewed along the rotational direction. The shape in a plan view of the first modification region r1 and the second modification region r2 is formed into an approximately triangular shape formed by partitioning the previously described revolving plane RA through which the receiving area 21 passes in a direction intersecting the above-mentioned revolving direction.

Each device provided in the first modification region r1 and the second modification region r2 has a common configuration. Therefore, the first modification region r1 will be described with reference to FIG. 8, which is a common enlarged vertical cross-sectional view. As illustrated in FIG. 8, the first modification region r1 includes a first gas discharge port 703 for supplying a modification gas from the peripheral side to the central side of the turntable 2 and a second gas discharge port 704 for supplying a modification gas from the central side to the peripheral side of the turntable 2. The first gas discharge port 703 and the second gas discharge port 704 form a modification gas supply unit for supplying the modification gases $H_2$ and $NH_3$ to the wafer W.

The first gas discharge port 703 is provided on the inner circumferential surface of the opening in the top plate 12 supporting the dielectric window 61 so as to supply a gas to the lower region of the dielectric window 61 provided in the antenna unit 60 of the plasma forming unit 6 (6B) described below. The first gas discharge port 703 is disposed at a plurality of locations along a side on the peripheral side of the turntable 2 in the first modification region r1, with intervals therebetween. The first gas discharge port 703 communicates with a first gas supply passage 184 that extends along the side on the peripheral side of the first modification region r1.

The second gas discharge port 704 is positioned at a plurality of locations (for example, two locations) spaced apart from each other along a region on the apex side of the approximately triangular shape opposite to the side on the peripheral side including the first gas discharge port 703. The second gas discharge port 704 communicates with a common second gas supply passage 185 provided in the region on the apex side of the first modification region r1.

In this example, the first modification process in the cycle of the film deposition process to be described later and the second modification process after the cycle of the film deposition process are performed as the modification process. Hydrogen ($H_2$) gas is used as a modification gas of the first modification process, and $H_2$ gas and $NH_3$ gas are used as the modification gas of the second modification process. For this reason, the first gas supply passage 184 is connected to an $H_2$ gas supply source 55 via an open/close valve V61 and a flow control section 551, and is connected to an $NH_3$ gas supply source 54 via an open/close valve V62 and a flow control section 541. Similarly, the second gas supply passage 185 is connected to the $H_2$ gas supply source 55 via an open/close valve V71 and a flow control section 552, and to the $NH_3$ gas supply source 54 via an open/close valve V72, and a flow control section 542. Thus, $H_2$ gas and $NH_3$ gas are mixed downstream of the valves V61 and V71, respectively, in the middle of the pipe, and discharged into the vacuum chamber 11 from the first gas discharge port 703 and the second gas discharge port 704.

Further, as illustrated in FIGS. 3 and 8, the first modification region r1 includes a plasma forming unit 6 (6B) that provides a plasma forming mechanism for plasma formation of the above-described modification gas. As for the configuration of the plasma forming unit 6B, because the common configuration with the plasma forming unit 6A for the reaction gas described with reference to FIG. 6 can be used, the description will not be repeated. Further, as viewed along the rotational direction of the turntable 2, an exhaust groove 190B including an exhaust port 190B for evacuating the modification gas to the outside of the vacuum chamber 11 is provided in the bottom portion of the chamber body 13 upstream of the first modification region r1 and between the turntable 2 and the inner wall surface of the vacuum chamber 11.

The second modification region r2 is configured similar to the first modification region r1, and the plasma forming unit 6 (6C) that constitutes a plasma forming mechanism for plasma formation of the modification gas is similar to that of the first modification region r1. The exhaust port 190C for the modification gas in the second modification region r2 is provided downstream of the rotational direction in the second modification region r2.

In the first modification region r1 and the second modification region r2, the modification gas is discharged from the first gas discharge port 703 on the peripheral side of the turntable 2 and the second gas discharge port 704 on the central side of the turntable 2 in a direction intersecting the revolving direction of the receiving area 21. Referring to FIG. 2, in the first modification region r1, the modification gas flows in a direction away from the reaction region R2 toward the exhaust port 190B on the upstream side in the rotational direction, and in the second modification region r2, the modification gas flows in a direction away from the reaction region R2 toward the exhaust port 190C on the downstream side in the rotational direction.

In the present embodiment, an example of including a gas injector 70 and an exhaust box 80 in the reaction region R2 has been described. However, such a configuration can be applied to all of the adsorption region R1 that supplies the source gas, the first modification region r1 for modification, and the second modified region r2 for modification. This is because forming a uniform gas flow in the radial direction is desired, at a uniform concentration and a uniform flow rate in all the regions.

Thus, the gas injector 70 and the exhaust box 80 may be applied to any of the adsorption region R1, the reaction region R2, the first modification region r1, and the second modification region r2, and may be applied to a plurality of regions.

Example of Film Deposition Process

Figure 9:
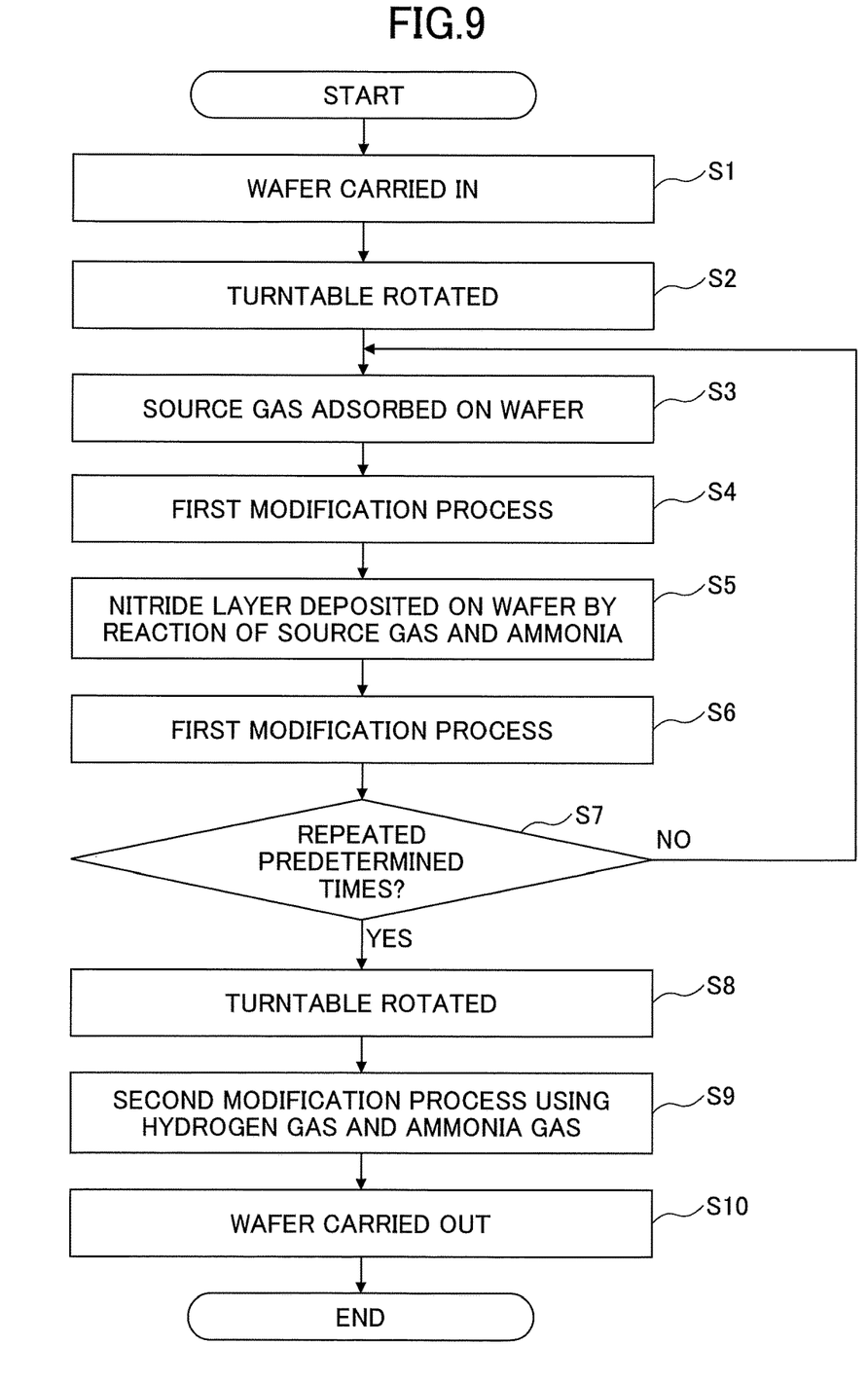
FIG. 9 is a process flow diagram illustrating an example of a film deposition processing method.

Hereinafter, an example of a film deposition processing method performed using the substrate processing apparatus will be described with reference to FIG. 9. FIG. 9 is a process flow diagram showing an example of a film deposition processing method.

In the film deposition processing method using the substrate processing apparatus according to the present embodiment, a step of depositing a SiN film on a wafer W is performed by repeating a process multiple times of supplying a source gas to the wafer W first, then supplying NH3 gas, and thereby forming a silicon nitride film on the wafer W. In this process, to begin with, the gate valve of the entry/exit section 101 is opened, and the wafer W is carried into the vacuum chamber 11 by an external transfer mechanism. Then, in Step S1, lifting pins (not illustrated) are used to deliver the wafer to the receiving area 21 of the turntable 2. The wafer W is transferred to the turntable 2 by intermittently rotating the turntable 2, and the wafer W is placed on all the receiving areas 21. Subsequently, the transfer mechanism is drawn back, and the gate valve of the entry/exit section 101 is closed. On this occasion, the inside of the vacuum chamber 11 is evacuated to a predetermined pressure by an evacuation mechanism 56 and an evacuation mechanism of the source gas unit 3. A purge gas is supplied from the purge gas supply port 311.

Then, the turntable 2 is rotated clockwise to heat the wafer W by a heater 46 while maintaining a predetermined rotational speed (step S2). When a temperature sensor (not illustrated) detects that the temperature of the wafer W has reached a predetermined set temperature, for example, 475° C., the supply of the source gas (DCS gas) from the gas discharge holes 331 of the source gas unit 3, the supply of $NH_3$ gas and Ar gas from the gas injector 70 provided in the side wall 81 upstream of the exhaust box 80 of the reaction region R2, the supply of $H_2$ gas from the first gas discharge port 703 and the supply of $H_2$ gas from the second gas discharge port 704 provided in the first modification region r1 and the second modification region r2, respectively, start. In addition, upon starting the supply of these gases, the microwave is supplied from the antenna unit 60 of the plasma forming unit 6 (6A to 6C).

As described above, the configuration including the gas injector 70 and the exhaust box 80 is applicable not only to the reaction region R2 but also to all the process regions. In the applied region, the gas may be supplied to the wafer W at a uniform concentration and a uniform flow rate in the radial direction.

Thus, while each gas is supplied and plasma is formed, the pressure in the vacuum chamber 11 becomes between 66.5 Pa (0.5 Torr) and 665 Pa (5 Torr), and 266 Pa (2 Torr) in this example. In the source gas unit 3, DCS gas is discharged from the gas discharge holes 331 and Ar gas is discharged from the purge gas discharge hole 311 at a predetermined flow rate, respectively, and an exhaust gas is also evacuated from the exhaust port 321. This causes DCS gas to flow in the adsorption region R1, which is a limited region up to the exhaust port 321 surrounding the gas discharge holes 331. When the wafer W reaches the adsorption region R1 by rotation of the turntable 2, DCS gas is supplied to the surface of the wafer W as a source gas containing silicon and is adsorbed (Step S3). The turntable 2 continues to rotate, and the wafer W moves toward the outside of the adsorption region R1, while supplying a purge gas to the surface of the wafer W and removing the adsorbed excessive DCS gas.

In the first modification region r1, $H_2$ gas is converted to plasma, and a stream of $H_2$ gas is formed toward the exhaust port 190B. When the wafer W reaches the first modification region r1 by rotation of the turntable 2, the first modification process is performed by the active species of $H_2$ gas contained in the plasma, and H is bonded to the dangling bond in the SiN film, thereby forming a dense film (Step S4).

In the reaction region R2, $NH_3$ gas is converted to plasma and $NH_3$ gas forms a side flow in the exhaust box 80, while forming a flow from each outflow port 83 to 86 toward the exhaust port 190A. When each wafer W reaches the reaction region R2 by rotation of the turntable 2, active species, such as an N (nitrogen)-containing radical derived from $NH_3$ gas forming $NH_3$ gas plasma, are supplied to the surface of each wafer W. Thus, the active species of $NH_3$ gas is supplied to the wafer W and react with the source gas on the wafer W to form a nitride layer (SiN layer) (Step S5).

In the second modified region r2, $H_2$ gas is converted to plasma and a stream of $H_2$ gas is formed toward the exhaust port 190C. When the wafer W reaches the second modification region r2 by rotation of the turntable 2, the first modification process is performed by the active species of $H_2$ gas contained in the plasma, and the SiN film is modified to a dense film (Step S6).

The cycle of processes performed in the adsorption region R1, the first modification region r1, the reaction region R2, and the second modification region r2 is defined as one cycle of the deposition cycle. Then, in step S7, until it is determined that the deposition cycle has been repeated a preset number of times, the supply of DCS gas, the supply of the active species of $H_2$ gas, the supply of the active species of $NH_3$ gas and the active species of $H_2$ gas are repeated in sequence, and SiN is deposited on the surface of the wafer W to form a film of the SiN layer.

In Step S7, when it is determined that the deposition cycle has been repeated a preset number of times, that is, when the thickness of the SiN film increases and a SiN film having a desired thickness is formed, the deposition process ends. For example, discharge and exhaustion of each gas in the source gas unit 3 is stopped. The $NH_3$ gas supply and power supply in the reaction region R2 and the $H_2$ gas supply in the first modification region r1 and the second modification region r2 are also stopped, respectively.

Subsequently, if necessary, the process of activating $H_2$ gas and $NH_3$ gas and supplying the activated gas to the wafer W to modify the SiN film (second modification process) is performed. For example, in Step S8, the pressure in the vacuum chamber 11 and the temperature of the turntable 2 are set to the same as those in the film deposition process, respectively, and the second modification process is started while the turntable 2 is rotated. In Step S9, the second modification process is performed in the first modification region r1 and the second modification region r2 by supplying the second modification gas $H_2$ gas and $NH_3$ gas and supplying power to the plasma forming units 6B and 6C. The $NH_3$ and Ar gas supply in the source gas unit 3 and the reaction region R2, and the power supply to the plasma forming unit 6A remain stopped.

In the first modification region r1 and the second modification region r2, a mixture of $H_2$ gas and $NH_3$ gas is supplied from the first gas discharge port 703 and the second gas discharge port 704, respectively. That is, in this example, $H_2$ and $NH_3$ gases are supplied to the wafer W simultaneously. $H_2$ and $NH_3$ gases are then activated (plasma) by microwaves of the plasma forming units 6B and 6C to produce the active species of $H_2$ gas and the active species of $NH_3$ gas. These active species then bind H to dangling bonds of the SiN film and modify the SiN film to a dense film. Because DCS gas contains chlorine (Cl), if DCS gas is used as the source gas, the chlorine component may be incorporated into the deposited SiN film as an impurity. Therefore, by activating a mixture of $H_2$ gas and $NH_3$ gas in the first and second modification regions r1 and r2, the chlorine component contained in the thin film is released from the thin film by the action of H radicals, and the thin film is modified to a purer (dense) nitride film.

In this manner, after a film is deposited on the surface of the wafer W, the wafer W is removed from the vacuum chamber 11 as illustrated in step S10. Thus, a series of film deposition processes is performed.

In the above-described film deposition process, by adopting the configuration illustrated in FIGS. 5 and 7 and applying the gas injector 70 and the exhaust box 80 to the film deposition process, a gas can be supplied at a radially uniform concentration and flow rate.

Thus, according to the substrate processing apparatus according to the present embodiments, by providing the exhaust box so that the side wall on the downstream side of the exhaust box is located at least partially upstream of the exhaust port, supplying gas to the exhaust box from the upstream side of the exhaust box, and providing the outflow port such that the conductance increases as the outflow port in the side wall on the downstream side moves away from the exhaust port, the concentration and flow rate of the gas in the exhaust box can be made uniform in the radial direction of the turntable, thereby improving the uniformity of the substrate processing across the surface of the substrate.

While the preferred embodiments of the invention have been described in detail above, the invention is not limited to the embodiments described above, and various modifications and substitutions can be made to the embodiments described above without departing from the scope of the present disclosure.

According to the present disclosure, a distribution of gas in a radial direction of a turntable can be made uniform.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A substrate processing apparatus, comprising:
   a process chamber;
   a turntable provided in the process chamber and configured to receive a substrate on a surface along a circumferential direction;
   at least one exhaust port provided on an outer side of the turntable and configured to evacuate the process chamber;
   at least one exhaust box provided in a space between a ceiling surface of the process chamber and the surface of the turntable so as to surround a certain region along the circumferential direction and a radial direction of the turntable by side walls so as to include a region upstream of the at least one exhaust port in a rotational direction of the turntable; and
   a gas supply unit configured to supply a gas into the at least one exhaust box,
   wherein the at least one exhaust box includes at least one outflow port in a side wall extending along a radial direction of the turntable, the side wall being provided closest to the at least one exhaust port of the side walls of the at least one exhaust box, such that a conductance of a first gas flowing out of the at least one exhaust box increases with increasing distance from the at least one exhaust port and that the conductance of the first gas flowing out of the at least one exhaust box becomes greater than a conductance of a second gas flowing toward the at least one exhaust port from any other region in the process chamber.

2. The substrate processing apparatus as claimed in claim 1, wherein an upper end of the at least one exhaust box is coupled to the ceiling surface of the process chamber.

3. The substrate processing apparatus as claimed in claim 1, wherein the at least one outflow port has a slit shape extending in a lengthwise direction of the side wall.

4. The substrate processing apparatus as claimed in claim 1, wherein the gas supply unit is configured to supply the first gas into the at least one exhaust box from a side wall on the upstream side in the rotational direction of the turntable.

5. The substrate processing apparatus as claimed in claim 4, wherein the gas supply unit is configured to supply the first gas from a plurality of locations spaced in the rotational direction of the turntable.

6. The film deposition method as claimed in claim 1, wherein the at least one outflow port includes a plurality of outflow ports.

7. The film deposition method as claimed in claim 6, wherein the plurality of outflow ports is arranged such that a number and a shape of the plurality of outflow ports are adjusted to uniformize an amount of outflow of the first gas in the rotational direction of the turntable.

8. The substrate processing apparatus as claimed in claim 7, wherein only a single outflow port is provided in the side wall in the height direction at a first position closest to the at least one exhaust port of the plurality of outflow ports, and multiple outflow ports are provided in the side wall in the height direction at a second position farthest from the at least one exhaust port, the multiple outflow ports extending parallel to each other in a lateral direction.

9. The substrate processing apparatus as claimed in claim 1, wherein an inner wall of the at least one exhaust box is subject to thermal spraying.

10. The substrate processing apparatus as claimed in claim 1, wherein the at least one exhaust port is provided in a bottom surface of the process chamber.

11. The substrate processing apparatus as claimed in claim 1, wherein the gas supply unit is a source gas supply unit configure to supply a source gas.

12. The substrate processing apparatus as claimed in claim 1, wherein the gas supply unit is an oxidizing/nitriding gas supply unit configure to supply an oxidizing gas or a nitriding gas.

13. The substrate processing apparatus as claimed in claim 1,
wherein the at least one exhaust port, the gas supply unit and the at least one exhaust box include a plurality of exhaust ports, a plurality of gas supply units, and a plurality of exhaust boxes, respectively, and
wherein the plurality of gas supply units includes a source gas supply unit configured to supply a source gas and an oxidizing/nitriding gas supply unit configured to supply an oxidizing gas or a nitriding gas.

14. The substrate processing apparatus as claimed in claim 12, further comprising:
an antenna provided over the ceiling surface of the process chamber at a position in which an exhaust box of the plurality of exhaust box including the oxidizing/nitriding gas supply unit is provided.

\* \* \* \* \*